(12) United States Patent
Choi

(10) Patent No.: US 12,016,135 B2
(45) Date of Patent: Jun. 18, 2024

(54) DISPLAY DEVICE

(71) Applicant: Samsung Display Co., Ltd., Yongin-Si (KR)

(72) Inventor: Chul Hyun Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 96 days.

(21) Appl. No.: 17/089,552

(22) Filed: Nov. 4, 2020

(65) Prior Publication Data

US 2021/0051807 A1 Feb. 18, 2021

Related U.S. Application Data

(62) Division of application No. 15/655,448, filed on Jul. 20, 2017, now Pat. No. 10,863,632.

(30) Foreign Application Priority Data

Dec. 6, 2016 (KR) .......................... 10-2016-0165109

(51) Int. Cl.
*H05K 5/00* (2006.01)
*G02F 1/1333* (2006.01)
(Continued)

(52) U.S. Cl.
CPC ..... *H05K 5/0017* (2013.01); *G02F 1/133305* (2013.01); *G02F 1/133308* (2013.01);
(Continued)

(58) Field of Classification Search
CPC .... B32B 7/05; B32B 7/12; B32B 7/14; B32B 2307/418; B32B 2457/20;
(Continued)

(56) References Cited

U.S. PATENT DOCUMENTS 9,637,665 B2 5/2017 Shim
9,927,650 B1 * 3/2018 Almanza-Workman ......................
G02B 6/0055
(Continued)

FOREIGN PATENT DOCUMENTS

KR 10-1271521 B1 5/2013
KR 10-2013-0106731 A 9/2013
(Continued)

OTHER PUBLICATIONS

Correspond—Definition & Meaning _ Dictionary.com; printed Apr. 13, 2023.*
(Continued)

*Primary Examiner* — Eli D. Strah
(74) *Attorney, Agent, or Firm* — Innovation Counsel LLP

(57) ABSTRACT

The present disclosure provides a display device that include: a display panel that includes a display area and a peripheral area that is provided at the periphery of an edge of the display area; a window that is provided on one side of the display panel to protect the display panel; and an adhesive film that is provided between the display panel and the window to bond the display panel and the window to each other, wherein the adhesive film in an area that corresponds to the peripheral area and the adhesive film in an area that corresponds to the display area have different properties.

4 Claims, 16 Drawing Sheets

(51) Int. Cl.
- *H01L 51/52* (2006.01)
- *H10K 50/84* (2023.01)
- *H10K 50/854* (2023.01)
- *H10K 50/86* (2023.01)
- *H10K 59/80* (2023.01)
- *B32B 7/05* (2019.01)
- *B32B 7/14* (2006.01)
- *G02F 1/1335* (2006.01)

(52) U.S. Cl.
CPC .......... *H10K 50/84* (2023.02); *H10K 50/854* (2023.02); *H10K 50/865* (2023.02); *H10K 59/87* (2023.02); *H10K 59/877* (2023.02); *H10K 59/879* (2023.02); *B32B 7/05* (2019.01); *B32B 7/14* (2013.01); B32B 2307/418 (2013.01); B32B 2457/20 (2013.01); B32B 2457/208 (2013.01); C09J 2203/318 (2013.01); C09K 2323/05 (2020.08); G02F 1/133331 (2021.01); G02F 1/133504 (2013.01); G02F 1/133524 (2013.01); G02F 1/133562 (2021.01); G02F 2202/28 (2013.01); G02F 2203/023 (2013.01); *H10K 50/86* (2023.02); *H10K 59/8791* (2023.02)

(58) Field of Classification Search
CPC ........ B32B 2457/202; B32B 2457/206; B32B 2457/208; C09J 7/00; C09J 2203/318; C09J 2301/18; C09K 2323/05; G02F 1/133305; G02F 1/133308; G02F 1/133331; G02F 1/133504; G02F 1/133524; G02F 1/133562; G02F 2202/28; G02F 2203/023; H01L 51/5237; H01L 51/5246; H01L 51/5268; H01L 51/5275; H01L 51/5281; H01L 51/5284; H05K 5/0017

See application file for complete search history.

(56) References Cited

U.S. PATENT DOCUMENTS

| | | | |
|---|---|---|---|
| 10,446,788 | B2 | 10/2019 | You et al. |
| 11,349,095 | B2 | 5/2022 | You et al. |
| 2006/0083894 | A1 | 4/2006 | Vetrovec et al. |
| 2013/0155723 | A1* | 6/2013 | Coleman ............... G02B 6/009 362/621 |
| 2014/0118902 | A1 | 5/2014 | Kim |
| 2014/0192416 | A1 | 7/2014 | Wang |
| 2015/0004345 | A1* | 1/2015 | Chaung ................. C09J 5/06 428/189 |
| 2017/0012235 | A1* | 1/2017 | Kwon .................. H10K 50/858 |

FOREIGN PATENT DOCUMENTS

| | | |
|---|---|---|
| KR | 10-2014-0052732 A | 5/2014 |
| KR | 10-2014-0090366 A | 7/2014 |
| KR | 10-20150061791 A | 6/2015 |
| KR | 10-1584845 B1 | 1/2016 |
| KR | 10-2016-0073460 A | 6/2016 |

OTHER PUBLICATIONS

Overlap—Definition & Meaning_Dictionary.com; printed Jul. 27, 2023.*

Korean Notice of Allowance dated Apr. 12, 2024 corresponding to Application No. 10-2016-0165109, 6 pages.

* cited by examiner (Prior Art)

DISPLAY DEVICE

CROSS-REFERENCE TO RELATED APPLICATION

This application is a divisional application of U.S. patent application Ser. No. 15/655,448 filed on Jul. 20, 2017, which claims priority under 35 USC § 119 to Korean Patent Application No. 10-2016-0165109 filed in the Korean Intellectual Property Office on Dec. 6, 2016, the entire contents of which are incorporated herein by reference.

TECHNICAL BACKGROUND

(a) Technical Field

This disclosure relates to a display device.

(b) Description of the Related Art

As display devices have been researched and developed, a display device having various operating modes has appeared or is expected to appear. Research and development for various display devices such as a foldable display that can be folded and unfolded, a rollable display device that can be rolled up like a scroll, and a sliding or expandable display device that can be spirally wound or folded in a device and then expanded as necessary have been conducted.

A flexible display device that has a flexible property has triggered the research and development of the various display devices. By changing existing constituent elements that have rigidity to constituent element having flexibility, the shape can be freely deformed.

The above information disclosed in this Background section is only for enhancement of understanding of the background of the invention and therefore it may contain information that does not form the prior art that is already known in this country to a person of ordinary skill in the art.

SUMMARY

The present inventive concept has been made in an effort to provide a display device that can prevent light leakage which occurs because light cannot be completely blocked in a peripheral area other than a display area.

A technical object to be achieved in the present inventive concept is not limited to the aforementioned technical objects, and other not-mentioned technical objects will be obviously understood by those skilled in the art from the description below.

A display device according to an exemplary embodiment of the present inventive concept includes: a display panel that includes a display area and a peripheral area at the periphery of at least an edge of the display area; a window on one side of the display panel; and an adhesive film between the display panel and the window to bond the display panel and the window to each other, wherein the adhesive film, in an area that corresponds to the peripheral area, includes a plurality of through-holes.

In an area that corresponds to the peripheral area, a scattering layer may be between the display panel and the adhesive film.

A light blocking layer may be between the scattering layer and the display panel.

The display panel may include: a flat portion that includes a portion of the display area and is formed in a plane; and a curved portion that extends from one side of the flat portion and comprises another portion of the display area and also comprises the peripheral area, the curved portion having a curved surface; and at an area that corresponds to the curved surface, the adhesive film may include the plurality of through-holes.

The display device may further include a filling material that has a lower refractive index than that of the adhesive film and is filled in the plurality of through-holes.

The refractive index of the filling material may be about 1 to about 1.5.

A display device according to another exemplary embodiment of the present inventive concept includes: a display panel that includes a display area and a peripheral area at the periphery of at least an edge of the display area; a window on one side of the display panel; and an adhesive film between the display panel and the window to bond the display panel and the window to each other, wherein the adhesive film includes: a first adhesive film in an area corresponding to the display area; and a second adhesive film at the periphery of an edge of the first adhesive film and disposed in an area corresponding to the peripheral area, and the second adhesive film may have a refractive index lower than a refractive index of the first adhesive film.

A display device according to another exemplary embodiment of the present inventive concept includes: a display panel that includes a display area and a peripheral area at the periphery of at least an edge of the display area; a window on one side of the display panel; and an adhesive film between the display panel and the window to bond the display panel and the window to each other, wherein the adhesive film includes: a first area in an area that corresponds to the display area; and a second area in an area that corresponds to the peripheral area while surrounding an edge of the first area, and on one side of the adhesive film, the adhesive film of the second area has a rougher surface than the adhesive film of the first area, the one side of the adhesive film being bonded to the window.

According to the present disclosure, light leakage which may occur due to total internal reflection of light passed through a display panel of the display device that includes a flat surface and a curved surface can be prevented.

DETAILED DESCRIPTION OF THE EMBODIMENTS

Figure 1:
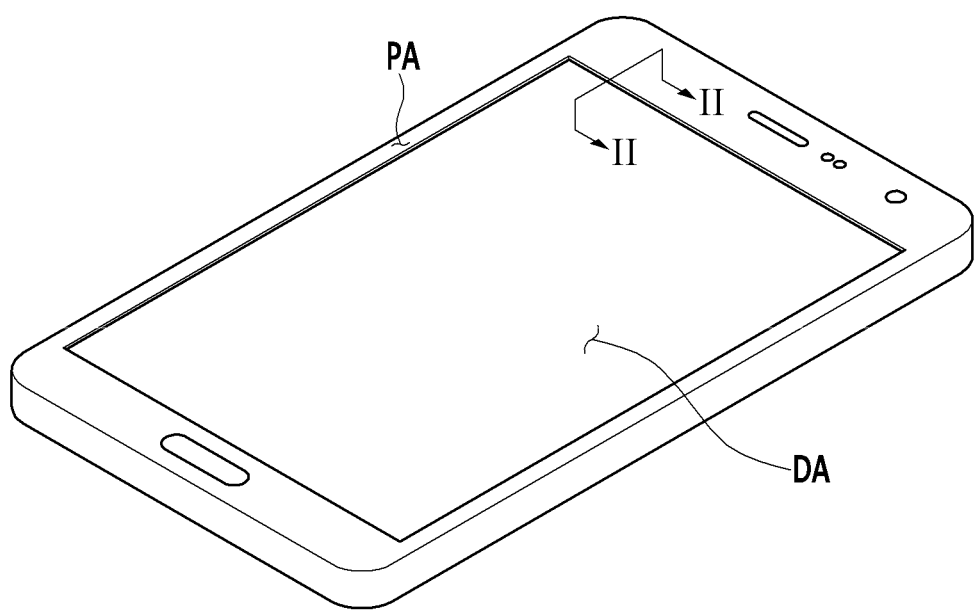
FIG. 1 is a schematic perspective view of a display device according to a first exemplary embodiment of the present inventive concept.

Hereinafter, exemplary embodiments of the present inventive concept will be described in detail with reference to the accompanying drawings. However, in describing the present inventive concept, a description of already known functions or configurations will be omitted so as to make the subject matter of the present inventive concept clear.

The drawings and description are to be regarded as illustrative in nature and not restrictive. Like reference numerals designate like elements throughout the specification. In addition, the size and thickness of each configuration shown in the drawings are arbitrarily shown for better understanding and ease of description, but the present inventive concept is not limited thereto.

In the drawings, the thickness of layers, films, panels, regions, etc., are exaggerated for clarity. In the drawings, for better understanding and ease of description, the thickness of some layers and areas is exaggerated. It will be understood that when an element such as a layer, film, region, or substrate is referred to as being "on" another element, it can be directly on the other element or intervening elements may also be present.

Figure 2:
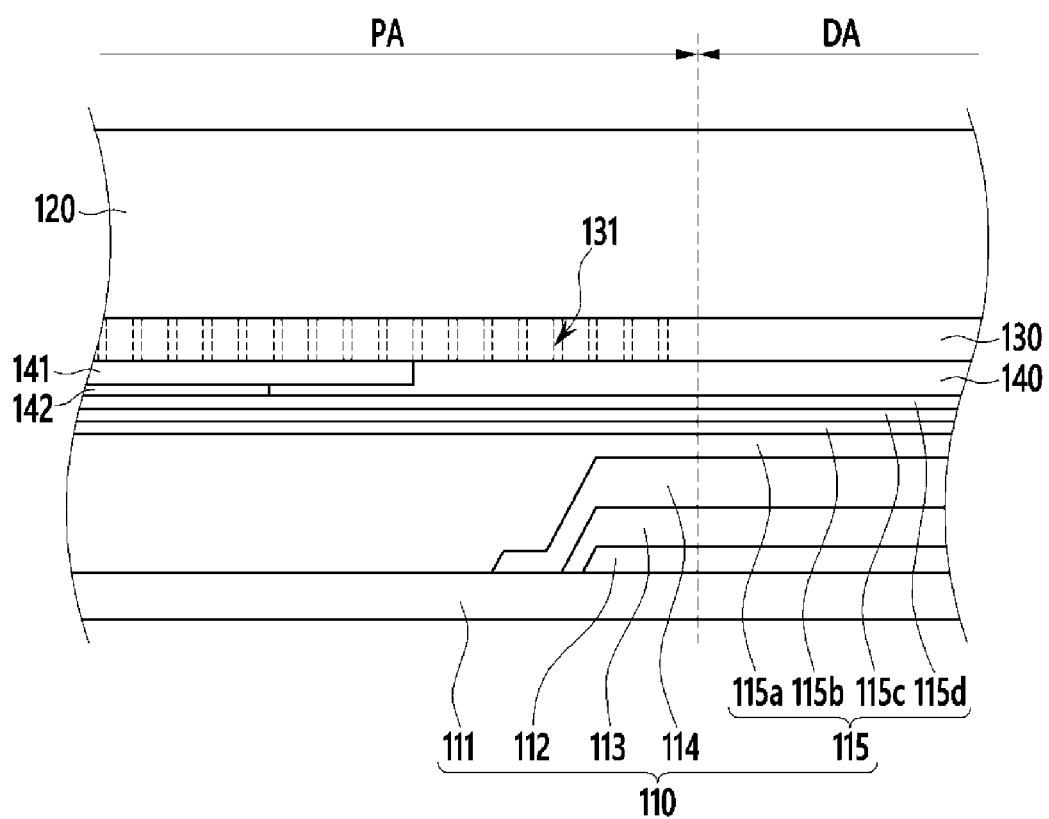
FIG. 2 is a schematic cross-sectional view of FIG. 1, taken along the line II-II.
Figure 3:
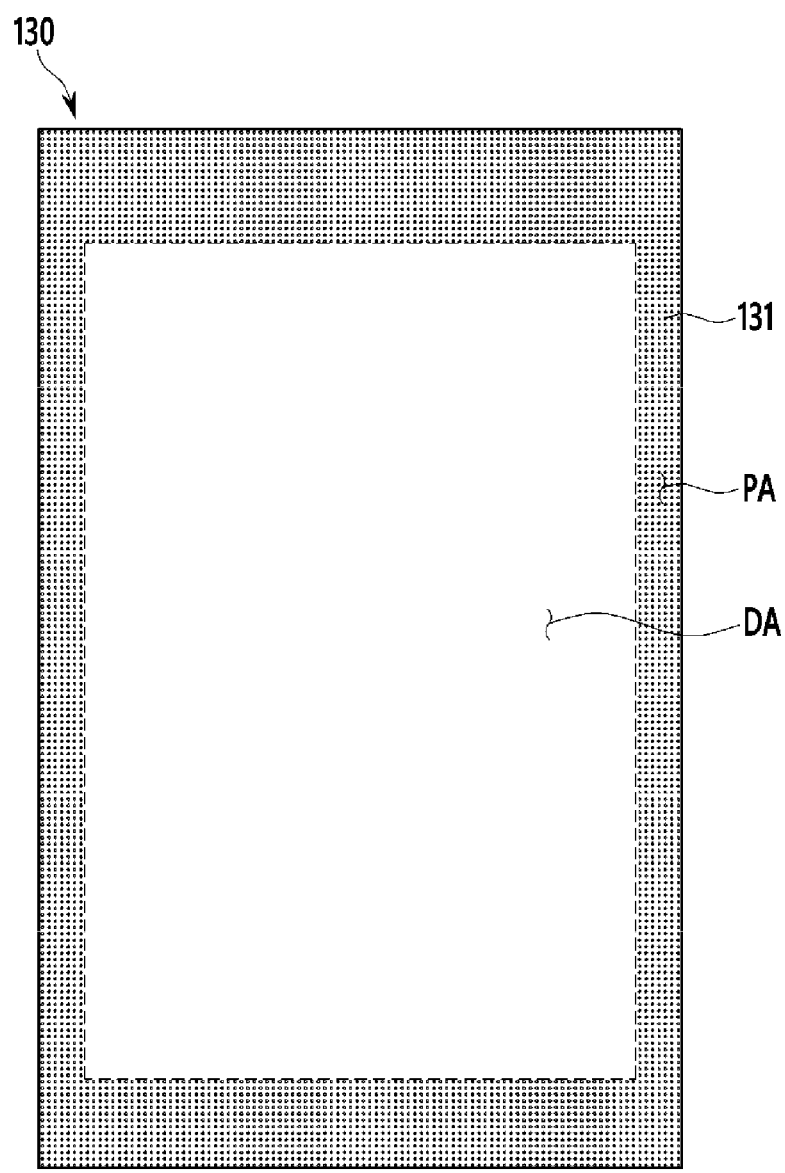
FIG. 3 is a schematic top plan view of an adhesive film according to the first exemplary embodiment of the present inventive concept.

Referring to FIG. 1 to FIG. 3, a display device according to a first exemplary embodiment of the present inventive concept will be described.

FIG. 1 is a schematic perspective view of a display device 100 according to the first exemplary embodiment of the present inventive concept, FIG. 2 is a schematic cross-sectional view of FIG. 1, taken along the line II-II, and FIG. 3 is a schematic top plan view of an adhesive film according to the first exemplary embodiment of the present inventive concept.

The display device 100 according to the present exemplary embodiment includes a display panel 110, a window 120, and an adhesive film 130.

The display panel 110 includes a display area DA and a peripheral area PA that is disposed at the periphery of the display area DA. The peripheral area PA may surround the edges of the display area DA, but the present exemplary embodiment is not limited thereto. Although it is not illustrated, the display area DA includes a plurality of pixels, and the peripheral area PA includes wires that are connected with external elements for supplying a signal and a power source to the plurality of pixels.

More specifically, the display panel 110 according to the present exemplary embodiment includes a base member 111, a driving element 112 that is disposed on the base member 111, a display element layer 113 that is disposed on the driving element layer 112, a thin film encapsulation layer 114 that is disposed on the display element layer 113, and a functional layer 115 that is disposed on the thin film encapsulation layer 114.

The base member 111 is a basic configuration where constituent elements having the above-stacked structure are disposed, and is made of a transparent material so as to assure light transmittance. In this case, the base member 111 of the present exemplary embodiment may be made of transparent glass or a polymer resin depending on a type of the display device 100. The base member 111 is disposed in any side of the display panel 110 to prevent a foreign substance from permeating into the driving element layer 112 and the display element layer 113 from the outside.

The driving element layer 112 controls the plurality of pixels that are disposed in the display element layer 113 by controlling a signal provided to the display element layer 113 for image display, and includes a plurality of transistors, each having a thin film shape.

The display element layer 113 includes a display element that adjusts the amount of light supplied from the outside, transmits the light, or emits light by itself by an electric field applied thereto. Each display element is disposed corresponding to each of the plurality of pixels. The display element layer 113 according to the present exemplary embodiment may include at least one of various display elements such as a liquid crystal layer, an organic light emission element layer, and the like, and may include various other display elements. Such a change in the type of the display element does not limit the scope of the present inventive concept.

The thin film encapsulation layer 114 is formed by alternately stacking organic material layers made of an organic material and inorganic material layers made of an inorganic material and prevents foreign substances such as moisture and the like from permeating into the display panel 110 from the outside.

The functional layer 115 refers to layers other than the above-described layers, and may be formed by stacking various layers such as a passivation layer 115a that planarizes a step between the display area DA and the peripheral area PA, a polarization layer 115b that applies a polarization characteristic to light that passed through the display element layer 113, a color filter layer 115c that changes wavelengths of the lights passed out the display element layer 113, a layer 115d that includes a touch sensing unit for receiving a signal from the outside by contact (for example, by a finger) and the like. Meanwhile, although it is not illustrated in the drawing, in the case of the touch sensing unit, it may not exist as an additional functional layer 115, and a touch sensing element may instead be provided in the thin film encapsulation layer 114 according to an exemplary embodiment.

The window 120 protects the display panel 110 from external impact and permeation of a foreign substance, and is made of transparent glass or a polymer resin having rigidity so as to endure external impact.

The adhesive film 130 is disposed between the display panel 110 and the window 120 to bond the display panel 110 and the window 120 to each other. Thus, the adhesive film 130 is made of a material that is transparent so as to transmit light supplied from the display panel 110 to the window 120, and has an adhesive property, and may be a transparent polymer resin such as polyethylene terephthalate (PET).

An adhesive layer 140 is disposed between the adhesive film 130 and the display panel 110. The adhesive layer 140 is also a transparent film having an adhesion property, and further enhances adhesion between the display panel 110 and the adhesive film 130 by being disposed therebetween.

In this case, the display panel 110 according to the present exemplary embodiment further includes a scattering layer 141 that is disposed in the same layer as the adhesive layer 140 in an area corresponding to the peripheral area PA. In addition, a light blocking layer 142 may be disposed between the scattering layer 141 and the display panel 110. The scattering layer 141 scatters light that is incident on the peripheral area PA to prevent the light incident thereon from being leaked to the outside or reduces the amount of light leaked to the outside by scattering the incident light, thereby preventing light leakage. The light blocking layer 142 includes a material that absorbs light, and blocks light emitted from the peripheral area PA from being leaked to the outside.

Referring to FIG. 2 and FIG. 3, the adhesive film of the display device 100 according to the first exemplary embodiment of the present inventive concept includes a plurality of through-holes 131 that are formed in an area corresponding to the peripheral area PA. The plurality of through-holes 131 of the adhesive film 130, only disposed in the area that corresponds to the peripheral area PA according to the present exemplary embodiment, may be formed by various processes such as a punching process, an etching process, and the like, and accordingly, a diameter and a shape of the through-hole 131 need not be regular.

Figure 4:
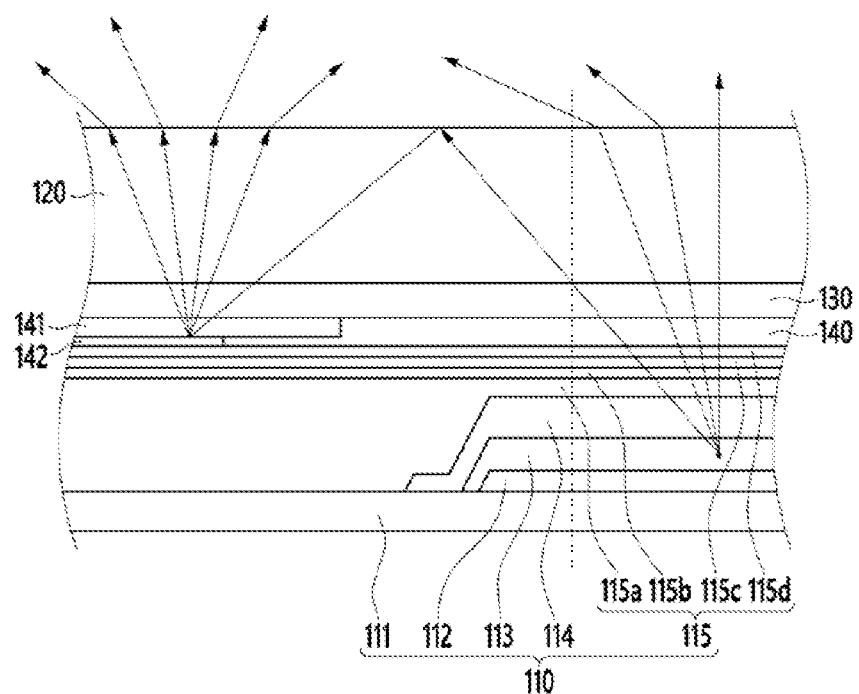
FIG. 4 is a schematic view of a state where total internal reflection occurs due to light generated from a display device according to the prior art.
Figure 5:
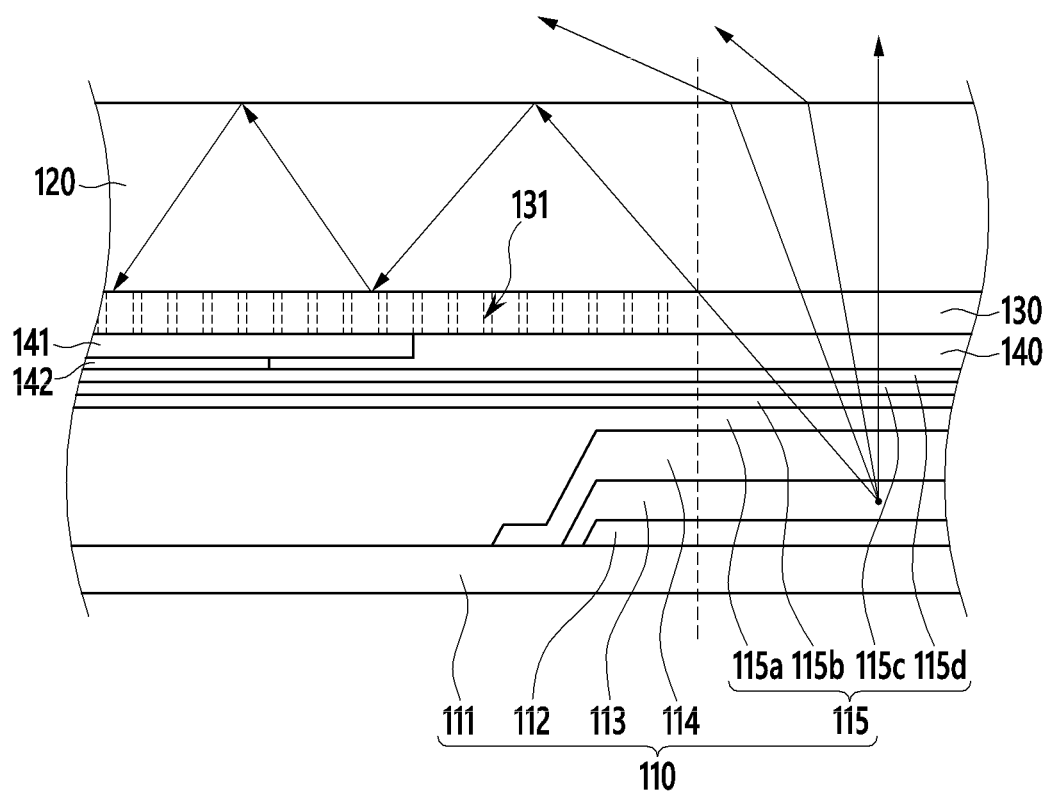
FIG. 5 is a schematic view of a state where total internal reflection occurs due to light generated from a display device according to FIG. 2.

FIG. 4 is a schematic view of a state where total internal reflection occurs due to light generated from a display device according to the prior art, and FIG. 5 is a schematic view of a state where total internal reflection occurs due to light generated from a display device according to FIG. 2.

Referring to FIG. 4 and FIG. 5, the thin film encapsulation layer 141 of the display panel 110 has a structure in which organic material layers and inorganic material layers are alternately stacked, and an organic material and an inorganic material that respectively form the organic material layer and the inorganic material layer have higher refractive indexes compared to air, and accordingly, light passed through the display element layer 113 can pass through the thin film encapsulation layer 114 without being totally reflected by the thin film encapsulation layer 114. After passing through the thin film encapsulation layer 114, the light passes through the adhesive film 130 that is made of an organic material and thus reaches the window 120. Then the light is incident on the peripheral area PA by being totally reflected by air having a low refractive index in an interface between the window 120 and the outside, such that light leakage may occur in the peripheral area PA. In particular, the light incident on the scattering layer 141 by the total internal reflection is scattered by the scattering layer 141 such that intensity of the light leakage may be increased as shown in FIG. 4. The ray of light totally internally reflected between 120 and the outside, which reaches 141 to be scattered, does not have an arrow indicating its direction of propagation as the other rays do.

However, the adhesive film 130 of the display device according to the exemplary embodiment of the present inventive concept includes the plurality of through-holes 131 that are formed in the area corresponding to the peripheral area PA, and the through-holes 131 of the adhesive film 130 are filled with air as shown in FIG. 5. Since air has a relatively low refractive index (i.e., a refractive index of 1), the travelling of light, which has been totally internally reflected from window 120, into the adhesive film 130 can be prevented.

As described, in the display device according to the present exemplary embodiment, light incident on the peripheral area PA is directly transmitted instead of travelling back into the adhesive film 130 from window 120, and thus the light is not scattered by the scattering layer 141 or absorbed by the light blocking layer 142.

Figure 6:
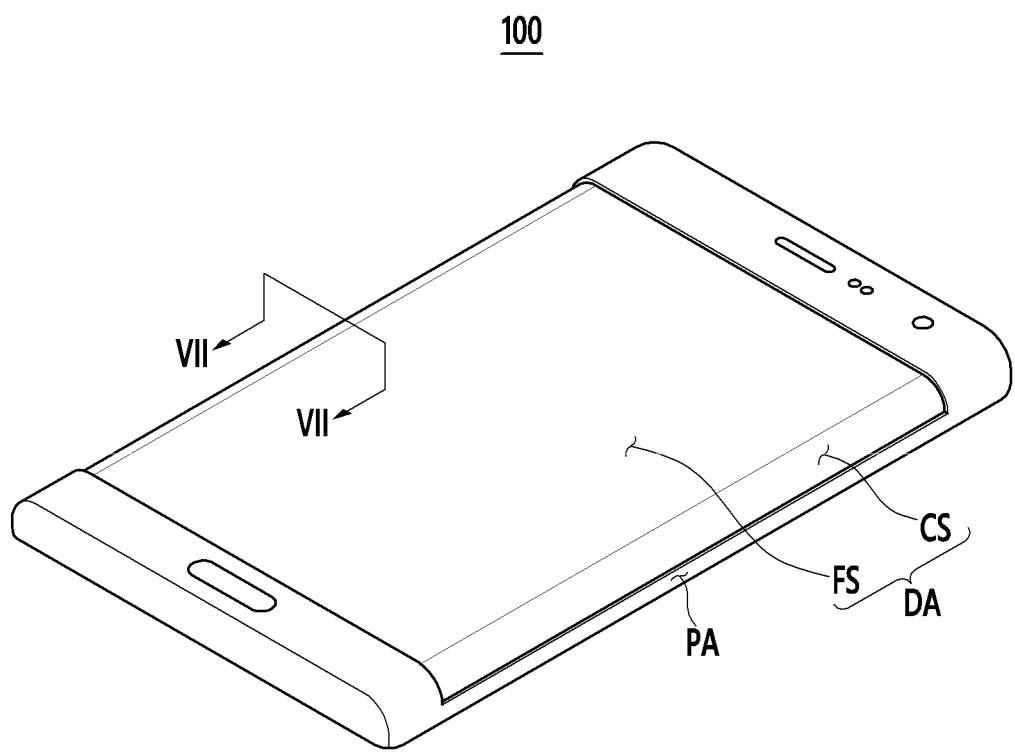
FIG. 6 is a schematic perspective view of a display device according to an exemplary variation of the first exemplary embodiment of the present inventive concept.

Next, an exemplary variation of the first exemplary embodiment will be described with reference to FIG. 6 and FIG. 7, together with FIG. 1. FIG. 6 is a schematic perspective view of a display device according to an exemplary variation of the first exemplary embodiment of the present inventive concept, and FIG. 7 is a schematic cross-sectional view of FIG. 6, taken along the line VII-VII.

Figure 7:
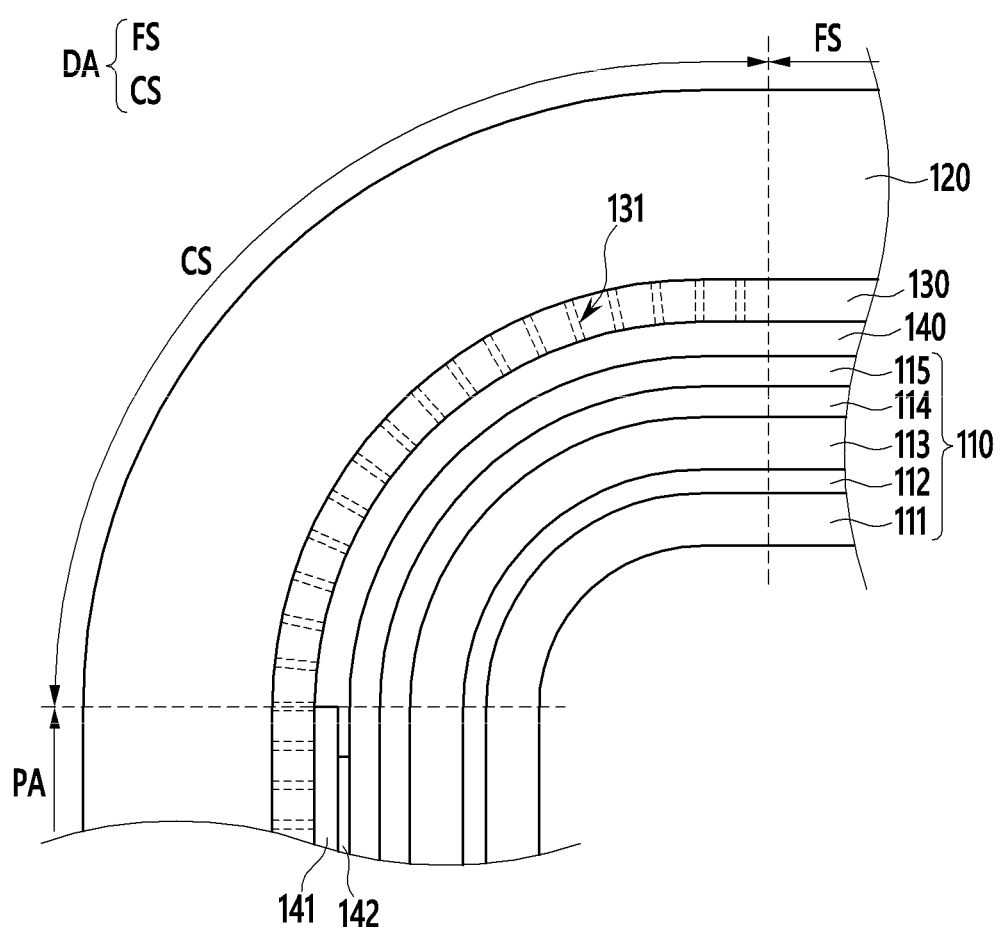
FIG. 7 is a schematic cross-sectional view of FIG. 6, taken along the line VII-VII.

Referring to FIG. 6 and FIG. 7, a display panel 110 of the display device according to the present exemplary variation is almost the same as the display device of the first exemplary embodiment, except that the display panel 110 includes a display area DA that includes a flat surface FS and a curved surface CS, and a peripheral area PA that is provided at the periphery of the display area DA. The flat surface FS of the display panel 110 of according to the present exemplary variation is a part of the display area DA, and one side or opposite sides of the curved surface CS form another portion of the display area DA by being extended while being smoothly curved in a direction that is different from an extension direction of a plane of the flat surface FS. The peripheral area PA is disposed at an edge of the curved surface CS.

In a comparative example, when display device includes a curved surface, total internal reflection of light ordinarily occurs due to the refractive index of the curved surface and thus light would be incident on the peripheral area, thereby causing light leakage.

However, in the exemplary embodiment of FIGS. 6 and 7, an adhesive film 130 of the display device 100 according to the present exemplary variation includes not only the peripheral area PA but also a plurality of through-holes 131 that are formed in an area corresponding to the curved surface CS of the display area DA as shown in FIG. 5.

Figure 8:
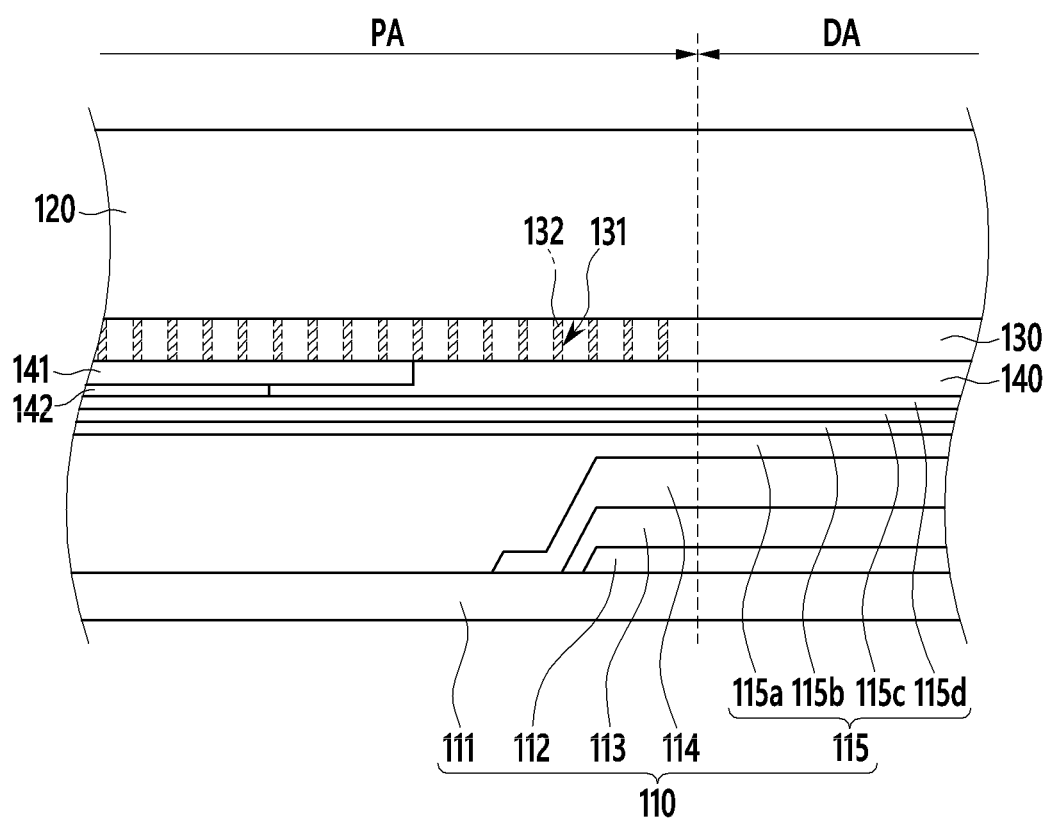
FIG. 8 is a cross-sectional view of a display device according to a second exemplary embodiment of the present inventive concept, taken along the line II-II of FIG. 1.

Next, a display device 100 according to a second exemplary embodiment of the present inventive concept will be described with reference to FIG. 8 and FIG. 9, together with FIG. 1. FIG. 8 is a schematic cross-sectional view of a display device 100 according to a second exemplary embodiment of the present inventive concept, taken along the line II-II of FIG. 1, and FIG. 9 is a schematic top plan view of an adhesive film 130 according to the second exemplary embodiment of the present inventive concept.

With respect to the detailed configuration of the display device 100 according to the present exemplary embodiment, a duplicate description of the above-described exemplary embodiment will be omitted.

Figure 9:
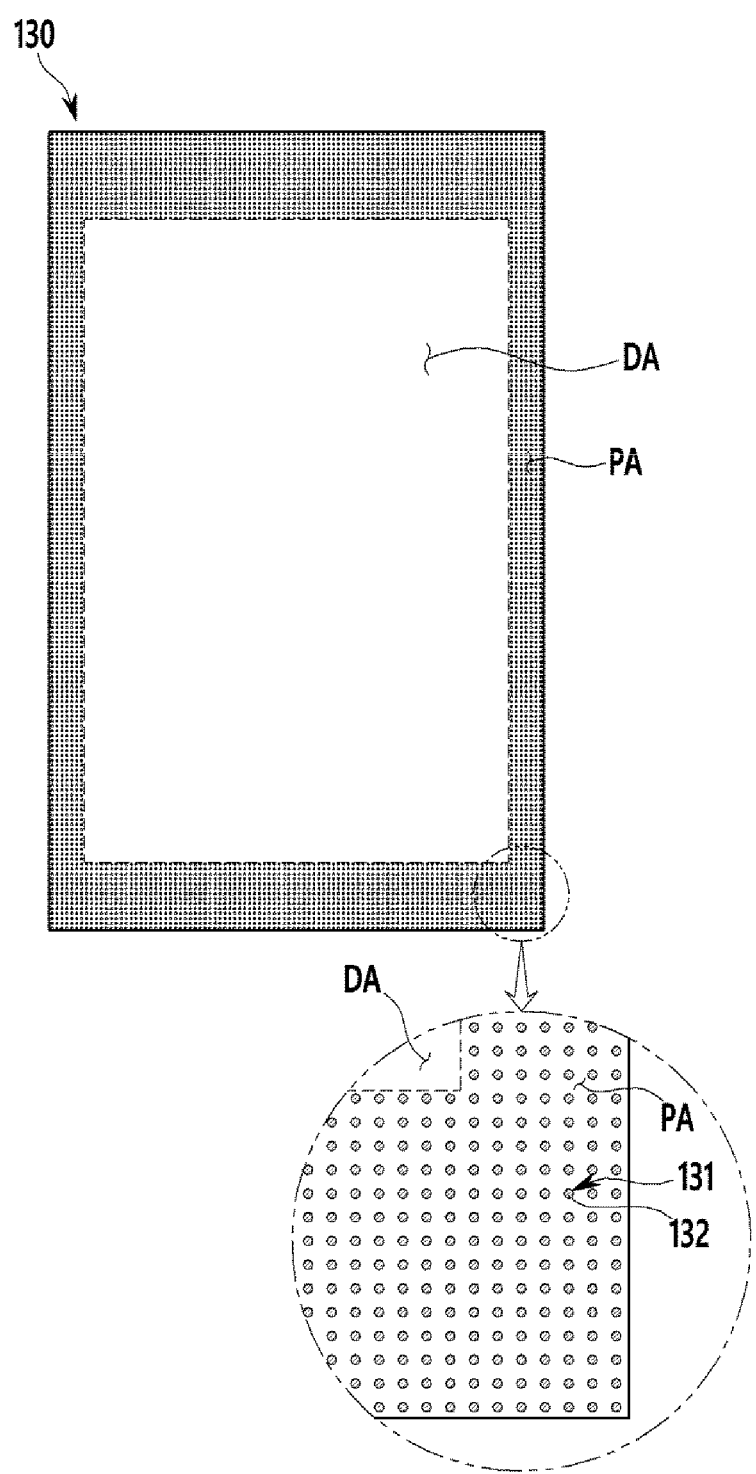
FIG. 9 is a schematic top plan view of an adhesive film according to the second exemplary embodiment of the present inventive concept.

Referring to FIG. 8 and FIG. 9, the adhesive film 130 of the display device 100 according to the present exemplary embodiment includes a plurality of through-holes 131 like the adhesive film 130 of the display device 100 according to the first exemplary embodiment.

In this case, a filling material 132 that is different from a material that forms the adhesive film 130 is filled in the through-holes 131 of the present exemplary embodiment. The filling material 132 has a lower refractive index than that of the adhesive film 130.

The refractive index of the filling material 132 filled in the through-holes 131 has a refractive index range that is similar to a refractive index of air, which is 1, and thus light, which was totally internally reflected between window 120 and outside air, can be prevented from travelling back into adhesive film 130. More specifically, the refractive index of the filling material 132 may be 1 or more and 1.5 or less. However, the refractive index of the filling material 132 is not limited thereto, and any refractive index of the adhesive film 130 that can prevent light incident on the peripheral area PA may be included in the scope of the present inventive concept.

As described, the adhesive film 130 of the display device 100 according to the present exemplary embodiment includes the plurality of through-holes 131 filled with the filling material 132 that has a lower refractive index than that of the material that forms the adhesive film 130, and thus light incident on the peripheral area PA is transmitted through and then the light is not scattered by the scattering layer 141 or absorbed by the light blocking layer 142.

Figure 10:
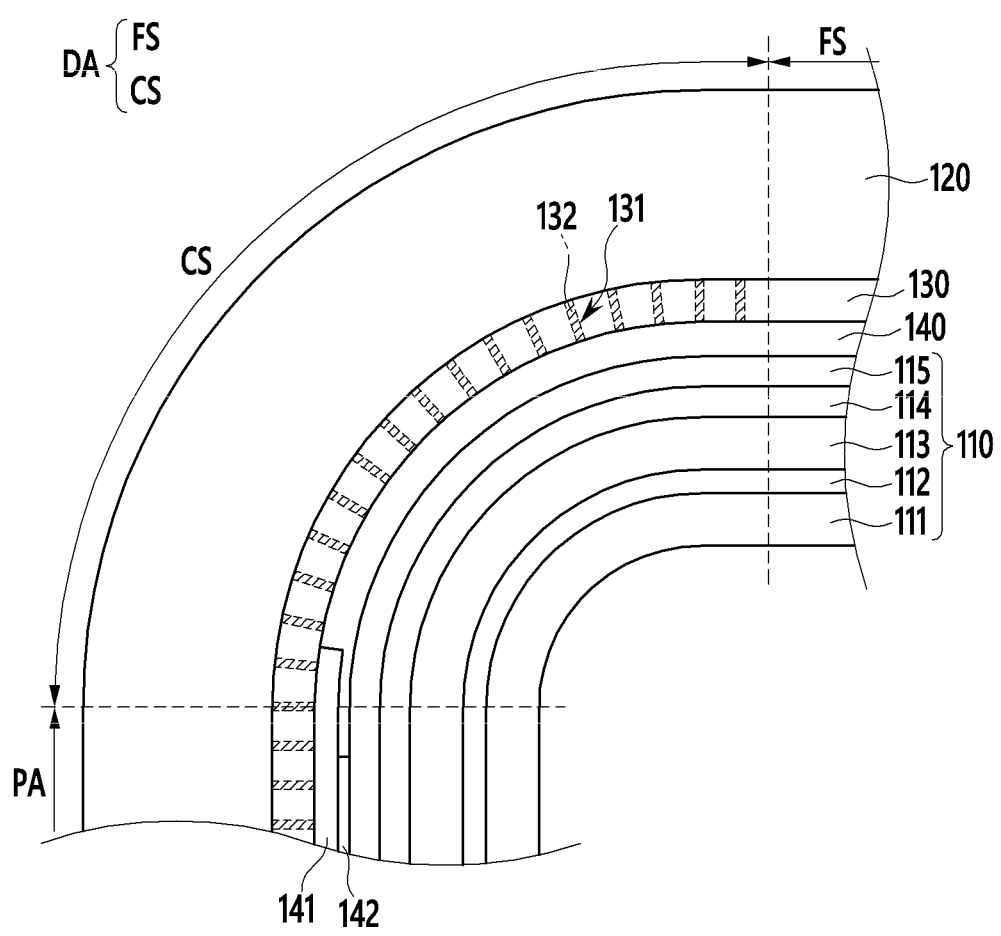
FIG. 10 is a schematic cross-sectional view of a display device according to an exemplary variation of the second exemplary embodiment of the present inventive concept, taken along the line VII-VII of FIG. 6.

Next, a display device 100 according to an exemplary variation of the second exemplary embodiment of the present inventive concept will be described with reference to FIG. 10, together with FIG. 6. FIG. 10 is a schematic cross-sectional view of a display device according to an exemplary variation of the second exemplary embodiment of the present inventive concept, taken along the line VII-VII of FIG. 6.

Referring to FIG. 6 and FIG. 10, a display device 100 according to the present exemplary variation includes a flat surface FS and a curved surface CS as shown in FIG. 10. The detailed configuration of the flat surface FS and the curved surface CS is the same as that of the exemplary variation of the first exemplary embodiment of FIG. 6 and FIG. 7, and therefore a duplicate description will be omitted.

As shown in FIG. 10, in the display device 100 that includes the flat surface FS and the curved surface CS, an adhesive film 130 in an area that corresponds to the curved surface CS includes a plurality of through-holes 131 as in the exemplary variation of the first exemplary embodiment. According to the present exemplary variation, as in the above-described second exemplary embodiment, the plurality of through-holes 131 formed in the adhesive film 130 in the area that corresponds to the curved surface CS are filled with a filling material 132.

The filling material 132 may be a material that has a lower refractive index than that of the adhesive film 130, and the filling material 132 can prevent light leakage by preventing travelling of light into adhesive film 130.

Figure 11:
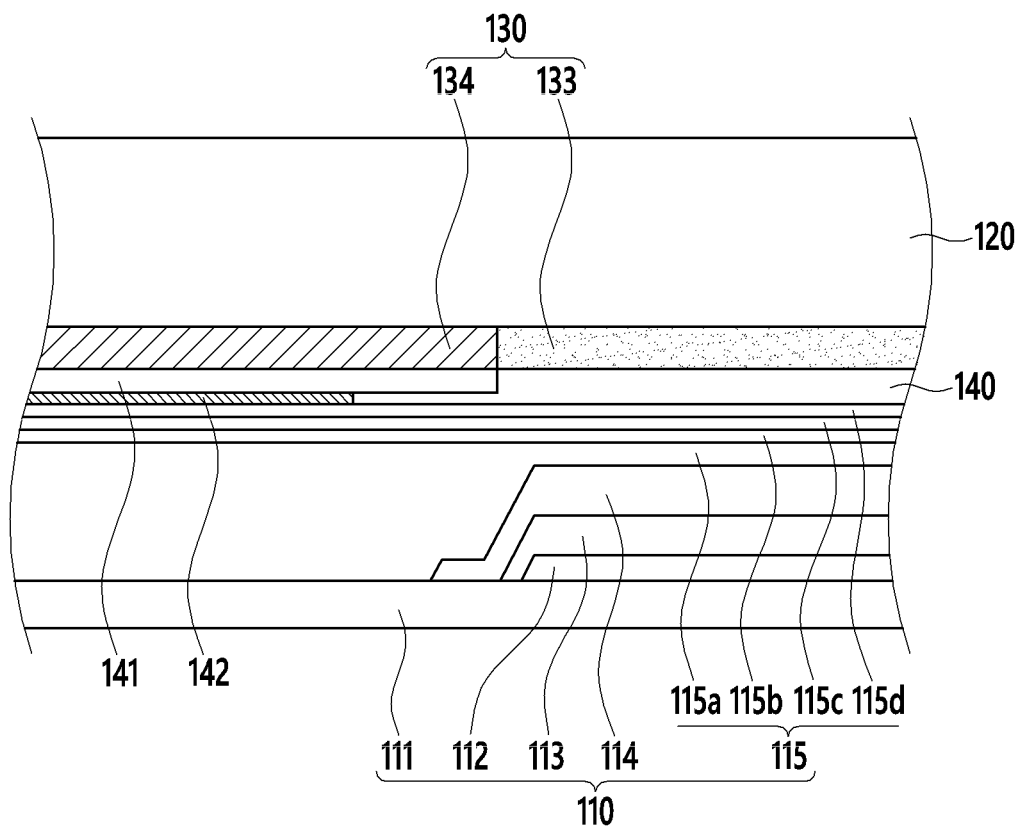
FIG. 11 is a cross-sectional view of a display device according to a third exemplary embodiment of the present inventive concept, taken along the line II-II of FIG. 1.

Next, a display device 100 according to a third exemplary embodiment of the present inventive concept will be described with reference to FIG. 11 and FIG. 12, together with FIG. 1. FIG. 11 is a schematic cross-sectional view of the display device 100 according to the third exemplary embodiment of the present inventive concept, taken along the line II-II of FIG. 1, and FIG. 12 is a schematic top plan view of an adhesive film 130 according to the third exemplary embodiment of the present inventive concept.

With respect to the detailed configuration of the display device 100 according to the present exemplary embodiment, a duplicate description of the above-described exemplary embodiments will be omitted.

Figure 12:
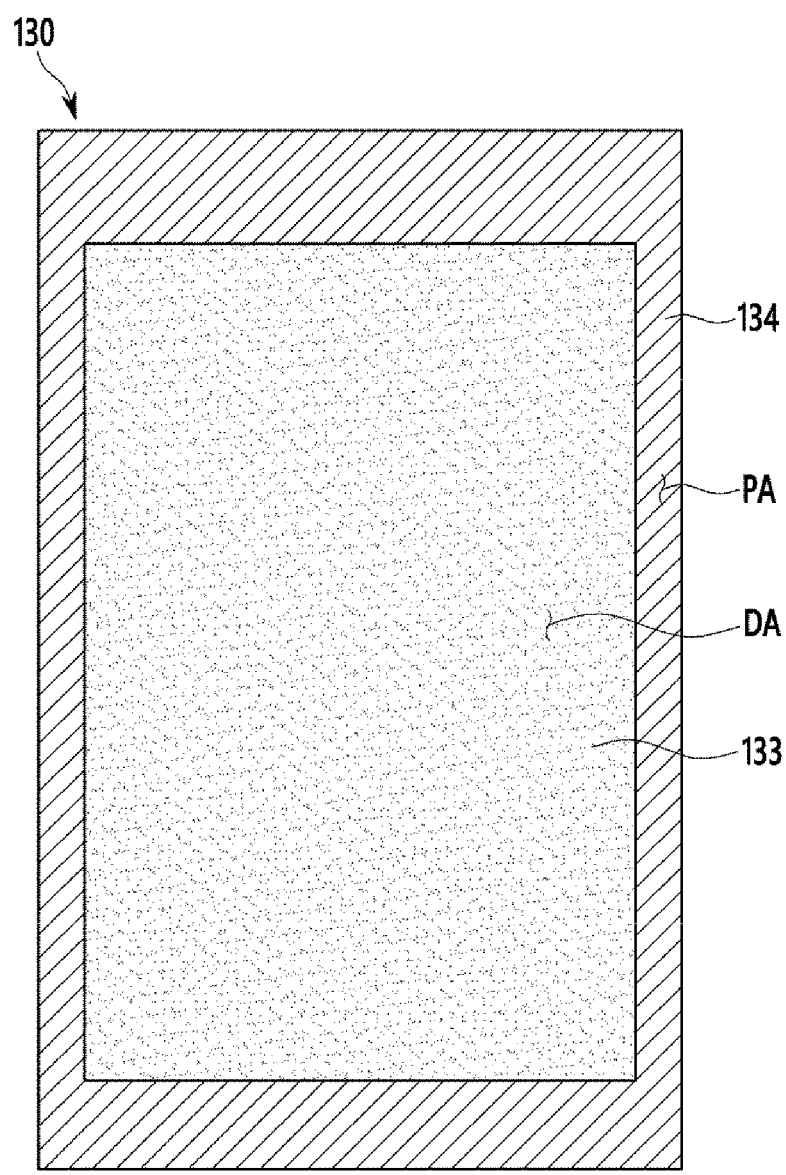
FIG. 12 is a schematic top plan view of an adhesive film according to the third exemplary embodiment of the present inventive concept.

Referring to FIG. 11 and FIG. 12, the adhesive film 130 according to the present exemplary embodiment includes a first adhesive film 133 and a second adhesive film 134.

The first adhesive film 133 is disposed in an area that corresponds to a display area DA of a display panel 110, and like the adhesive films 130 of the first and second exemplary embodiments, the first adhesive film 133 may be made of a material that is transparent and has an adhesion property.

The second adhesive film 134 is disposed in an area that corresponds to a peripheral area PA of the display panel 110, and like the first adhesive film 133, the second adhesive film 134 is made of a material that is transparent and has an adhesion property. However, compared to the first adhesive film 133, the second adhesive film 134 is made of a material that has a lower refractive index than that of the first adhesive film 133. As an example, the second adhesive film 134 may be made of the same material as of the filling material 132 that is filled in the through-holes 131 according to the second exemplary embodiment, but the present exemplary embodiment is not limited thereto.

The refractive index of the second adhesive film 134 has a refractive index range that is similar to that of air, which is 1, and more specifically, the refractive index of the second adhesive film 134 may be 1 or more and 1.5 or less. However, the refractive index of the second adhesive film 134 need not be limited thereto, and any refractive index of the second adhesive film 134, which can prevent propagation of light into adhesive film 130 may be included in the scope of the present inventive concept.

Figure 13:
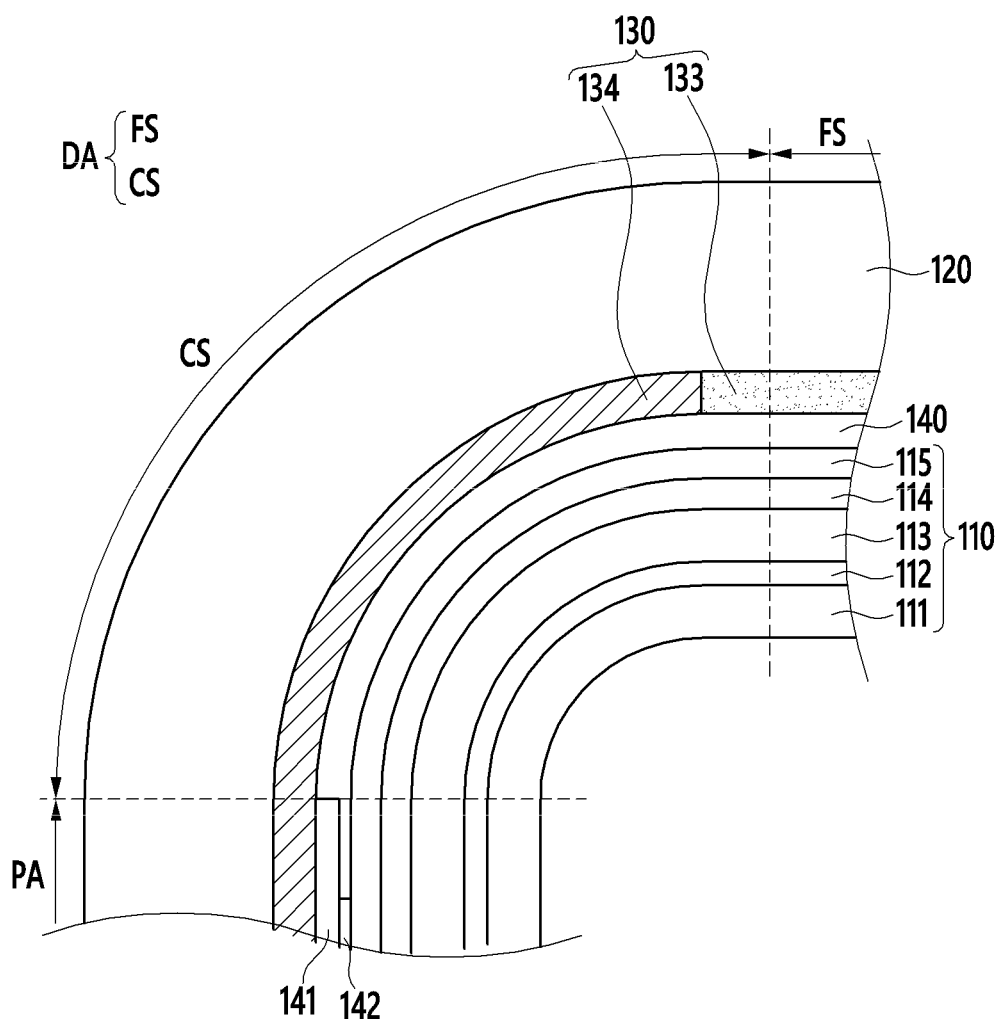
FIG. 13 is a schematic cross-sectional view of a display device according to an exemplary variation of the third exemplary embodiment of the present inventive concept, taken along the line VII-VII of FIG. 6.

Next, a display device 100 according to an exemplary variation of the third exemplary embodiment will be described with reference to FIG. 13, together with FIG. 6. FIG. 13 is a schematic cross-sectional view of a display device according to an exemplary variation of the third exemplary embodiment of the present inventive concept, taken along the line VII-VII of FIG. 6.

Referring to FIG. 6 and FIG. 13, the display device 100 according to the present exemplary variation includes a flat surface FS and a curved surface CS. The detailed configuration of the flat surface FS and the curved surface CS is the same as that of the exemplary variation of the first exemplary embodiment of FIG. 6 and FIG. 7, and therefore a duplicate description will be omitted.

As shown in FIG. 13, the display device 100 that includes the flat surface FS and the curved surface CS includes a first adhesive film 133 that is disposed in an area corresponding to the flat surface FS and a second adhesive film 134 that is disposed in an area corresponding to the curved surface CS. The second adhesive film 134 has a lower refractive index than that of the first adhesive film 133.

In the present exemplary variation, when the second adhesive film 134 that has a lower refractive index than that of the first adhesive film 133 is disposed in a location that corresponds to the curved surface CS, light leakage that may occur due to propagation of totally internally reflected light into adhesive film 130 can be prevented by the refractive index of the curved surface CS.

Figure 14:
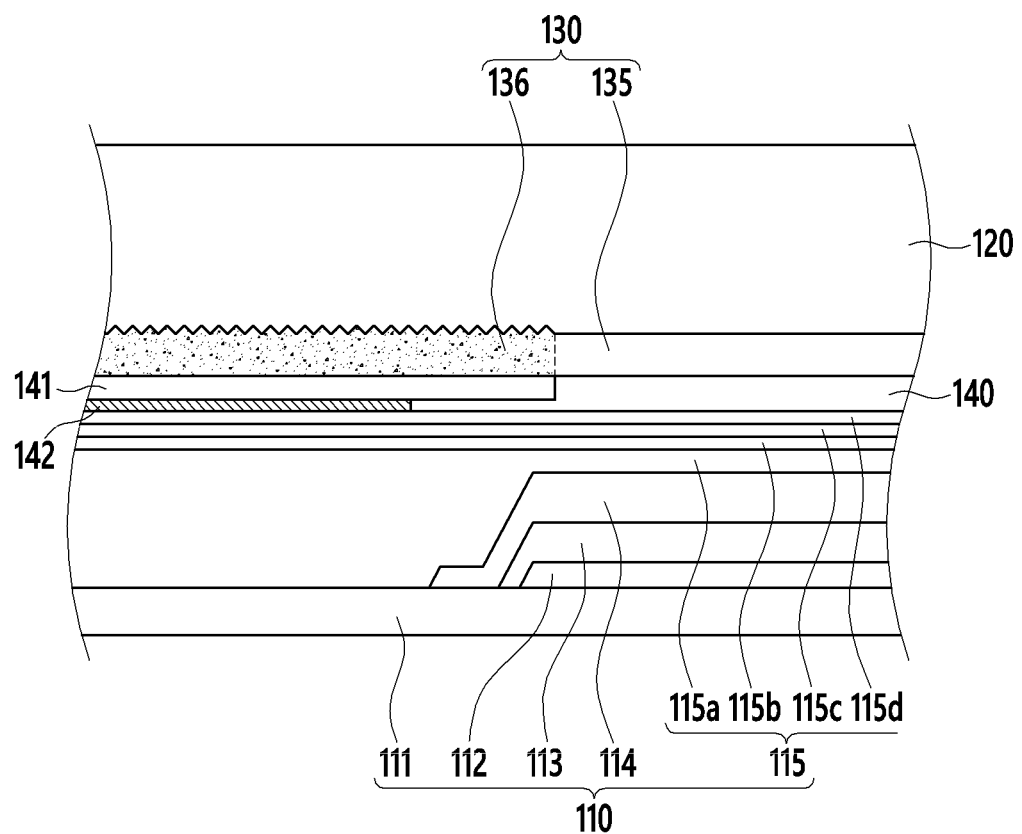
FIG. 14 is a cross-sectional view of a display device according to a fourth exemplary embodiment of the present inventive concept, taken along the line II-II of FIG. 1.

Next, a display device 100 according to a fourth exemplary embodiment of the present inventive concept will be described with reference to FIG. 14 and FIG. 15, together with FIG. 1. FIG. 14 is a schematic cross-sectional view of the display device 100 according to the fourth exemplary embodiment of the present inventive concept, taken along the line II-II of FIG. 1, and FIG. 15 is a schematic top plan view of an adhesive film 130 according to the fourth exemplary embodiment of the present inventive concept.

With respect to the detailed configuration of the display device 100 according to the present exemplary embodiment, a duplicate description of the above-described exemplary embodiments will be omitted.

Figure 15:
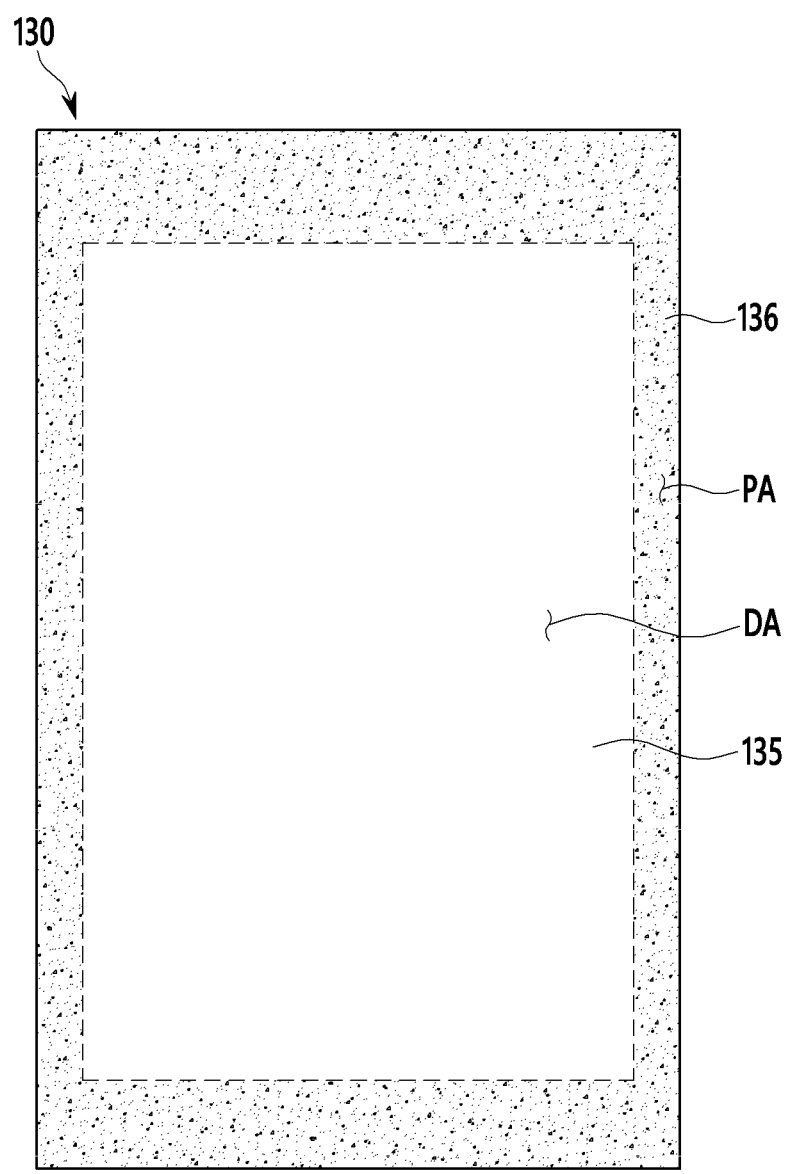
FIG. 15 is a schematic top plan view of an adhesive film according to the fourth exemplary embodiment of the present inventive concept.

Referring to FIG. 14 and FIG. 15, the adhesive film 130 of the display device 100 according to the fourth exemplary embodiment of the present inventive concept includes a first area 135 that corresponds to a display area DA of a display panel 110 and a second area 136 that corresponds to a peripheral area PA of the display panel 110. Surface roughness of a portion of the adhesive film 130, corresponding to the second area 136, is greater than that of a portion of the adhesive film 130, corresponding to the first area 135. That is, the adhesive film 130 that is formed corresponding to the second area 136 is has a rougher surface than that of the adhesive film 130 that is formed corresponding to the first area 135.

Referring to FIG. 14, the adhesive film 130 of the second area 136 of which roughness is changed is limited to a plane that contacts the window 120. Roughness of one side of the adhesive film 130 of the second area 136, contacting an adhesive layer 140 that includes a scattering layer 141, may be substantially the same as roughness of at least one side of first area 135.

When surface roughness at an interface between the window 120 and the adhesive film 130 of the second area 136 is increased, light may be incident on an area that corresponds to the peripheral area PA of the display panel 110; however, the light may be irregularly reflected by the interface having a rough surface, thereby preventing or reducing light leakage.

Figure 16:
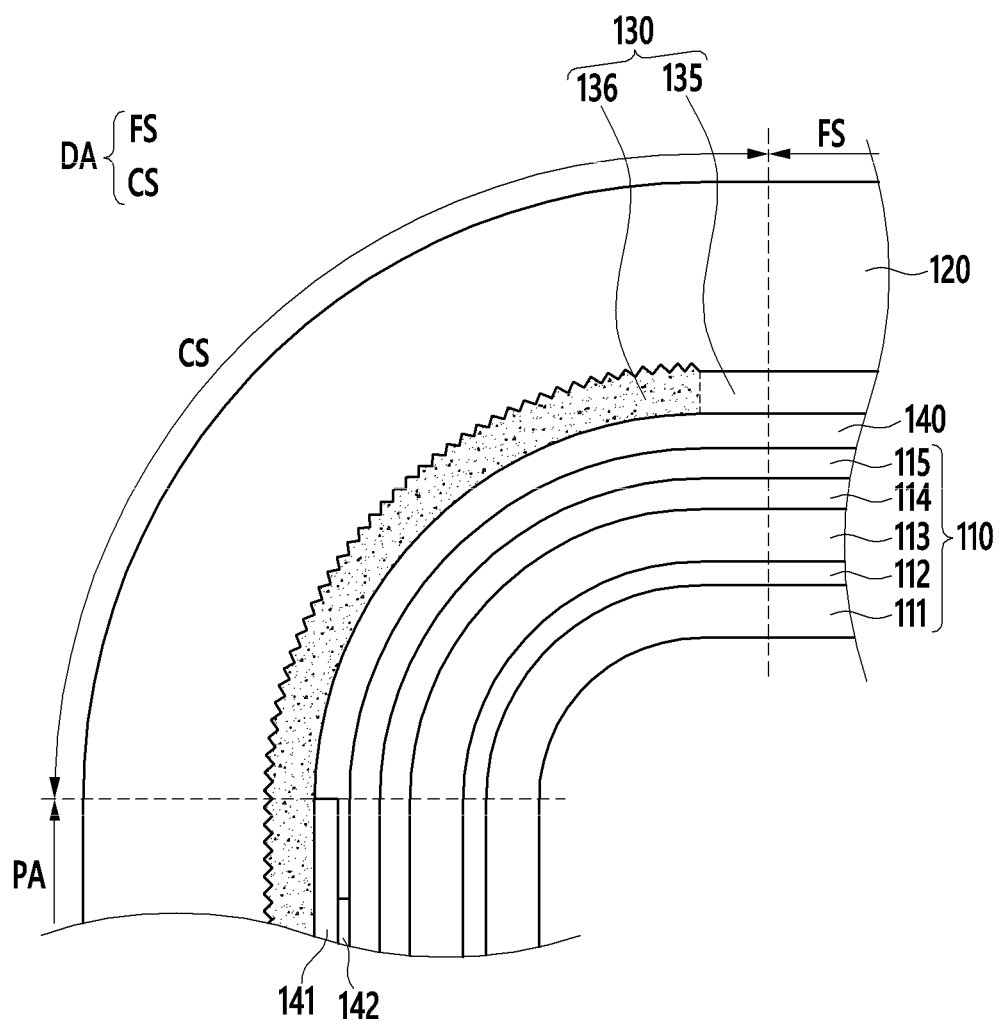
FIG. 16 is a schematic cross-sectional view of a display device according to an exemplary variation of the fourth exemplary embodiment of the present inventive concept, taken along the line VII-VII of FIG. 6.

Next, a display device 100 according to an exemplary variation of the fourth exemplary embodiment of the present inventive concept will be described with reference to FIG. 16, together with FIG. 6. FIG. 16 is a schematic cross-sectional view of the display device according to the fourth exemplary embodiment of the present inventive concept, taken along the line VII-VII of FIG. 6.

The display device 100 according to the present exemplary variation includes a flat surface FS and a curved surface CS as shown in FIG. 16. The detailed configuration of the flat surface FS and the curved surface CS is the same as that of the exemplary variation of the first exemplary embodiment of FIG. 6 and FIG. 7, and therefore a duplicate description will be omitted.

As shown in FIG. 16, in the display device 100 that includes the flat surface FS and the curved surface CS, surface roughness of an area of an adhesive film 130, which corresponds to the curved surface CS, is greater than surface roughness of a portion of the adhesive film 130, which corresponds the flat surface FS, according to the present exemplary embodiment. That is, in case of the present exemplary embodiment, the adhesive film 130 that corresponds to the curved surface CS has a rougher surface than the adhesive film 130 that corresponds to the flat surface FS.

When the adhesive film 130 of an area that correspond to the curved surface CS has a rougher surface than the adhesive film 130 of an area that corresponds to the flat surface FS, even though light passed through a display panel 110 is incident on the curved surface CS, the incident light is irregularly reflected by an interface that has a rough surface so that light leakage can be prevented or reduced.

Hereinabove, the display devices 100 according to the first to fourth exemplary embodiments of the present inventive concept have been described. According to the above-described exemplary embodiments of the present inventive concept, light leakage which may occur due to total internal reflection of light passed through the display panel 110 of the display device 100 that includes a flat surface or a curved surface can be prevented.

Although the specific exemplary embodiments have been described and illustrated above, the present inventive concept is not limited to the exemplary embodiments described herein, and it would be apparent to those skilled in the art that variations and modifications might be made to these embodiments without departing from the spirit and the scope of the invention. Therefore, the variations and modifications should not be individually differentiated from the technical spirit or the viewpoint of the present inventive concept, and it should be appreciated that modified exemplary embodiments will be included in the scope of the appended claims of the present inventive concept.

<Description of symbols>

100: display device
110: display panel
111: base member
112: driving element layer
113: display element layer
114: this film encapsulation layer
115: functional layer
120: window
130: adhesive film
131: through-hole
132: filling material
133: first adhesive film
134: second adhesive film
135: first area
136: second area
140: adhesive layer
141: scattering layer
142: light blocking layer
DA: display area
PA: peripheral area
FS: flat surface
CS: curved surface

What is claimed is:

1. A display device comprising:
a display panel that includes a display area and a peripheral area at the periphery of at least an edge of the display area;
a window on one side of the display panel;
an adhesive film between the display panel and the window to bond the display panel and the window to each other,
a scattering layer disposed directly adjacent to the adhesive film, and
an adhesive layer in an area corresponding to the display area,
wherein the adhesive film comprises:
a first adhesive film in an area corresponding to the display area; and
a second adhesive film at the periphery of an edge of the first adhesive film and disposed in an area corresponding to the peripheral area,
wherein the second adhesive film has a refractive index lower than a refractive index of the first adhesive film so that light from the display area to the peripheral area through the window is less reflected back to the window at a boundary between the second adhesive film and the window than at a boundary between the first adhesive film and the window, wherein the scattering layer and the second adhesive film entirely overlap one another, and wherein the first adhesive film comprises a lower surface that directly contacts the adhesive layer, and the first adhesive film and the second adhesive film have a similar height as each other.

2. The display device of claim 1, wherein the refractive index of the second adhesive film is 1 to 1.5.

3. The display device of claim 1, further comprising a light blocking layer between the scattering layer and the display panel.

4. The display device of claim 1, wherein the display panel comprises:

a flat portion that comprises a part of the display area and is in a plane; and a curved portion that extends from one side of the flat portion and comprises another portion of the display area and also comprises the peripheral area, the curved portion having a curved surface, and the first adhesive film is provided in an area corresponding to the flat portion and the second adhesive film is provided in an area corresponding to the curved portion.

* * * * *